310-322 SR

OR 3,997,804

T 89656

United States

Tamura et al.

3,997,804

Dec. 14, 1976

[54] MOUNTING FOR FLEXIBLE DIAPHRAGM PIEZOELECTRIC TRANSDUCER

[75] Inventors: Masaheko Tamura; Kiyononi Iwama; Toshikagu Yoshimi, all of Tokerozawa, Japan

[73] Assignee: Pioneer Electronic Corporation, Japan

[22] Filed: Feb. 12, 1975

[21] Appl. No.: 549,347

[30] Foreign Application Priority Data

Feb. 18, 1974 Japan ........................ 49-19526[U]

[52] U.S. Cl. ................................ 310/8.2; 310/9.1; 310/9.5

[51] Int. Cl.$^2$ ........................................ H01L 41/04

[58] Field of Search .............. 310/8.3, 8.5, 8.6, 9.1, 310/9 H, 9.5, 9.6, 8, 8.2; 179/110 A, 110 E, 111 R, 111 E, 180

[56] References Cited

UNITED STATES PATENTS

| | | | |
|---|---|---|---|
| 3,654,402 | 4/1972 | Roos | 179/110 A |
| 3,798,473 | 3/1974 | Murayama et al. | 310/8.2 X |
| 3,832,580 | 8/1974 | Yamamuro | 310/8.3 X |

*Primary Examiner*—Mark O. Budd
*Attorney, Agent, or Firm*—Woodhams, Blanchard and Flynn

[57] ABSTRACT

A piezoelectric electro-acoustic transducer which includes a support means, a piezoelectric diaphragm supported at its edge portions by the support means comprising at least a pair of fixing members arranged to oppose each other, and a resilient backing member brought into a contact with the diaphragm to impart to the diaphragm a suitable tension and/or resiliency. The resilient backing member has an area smaller than the substantial vibration area of the diaphragm so that portions of the diaphragm are left free from contact with the resilient backing member, whereby, it has become possible to improve the frequency characteristics and consequently obtain improved sound characteristics.

9 Claims, 3 Drawing Figures

MOUNTING FOR FLEXIBLE DIAPHRAGM PIEZOELECTRIC TRANSDUCER

This invention relates to a piezoelectric electro-acoustic transducer and more particularly to a piezoelectric electro-acoustic transducer which includes a support means, a piezoelectric diaphragm supported at its edge portions by the support means comprising at least a pair of fixing members arranged to oppose each other, and a resilient backing member brought into contact with the diaphragm to impart to the diaphragm a suitable tension and resiliency.

It has been proposed to provide a piezoelectric electro-acoustic transducer employing as a diaphragm a thin film which has piezoelectricity. (For example, see U.S. Pat. No. 3,832,580.) It is known to prepare a piezoelectric film used as a diaphragm for electro-acoustic transducer by employing a high molecular weight polymer as a base material. (See: "Polypeptides piezoelectric transducers," by E. Fukuda et al., 6th International Congress on Acoustics, D-31, Tokyo, 1968 and "The Piezoelectricity of Poly(vinylidene Fluoride)," by H. Kawai, Japan, J. Appl. Phys. 8, 975, 1969).

The conventional piezoelectric electro-acoustic transducer comprises, as shown in FIG. 1, a support means 2, a diaphragm 1 supported by the support means 2, and a resilient backing member 3 brought into contact with the diaphragm. The transducer is arranged so that the diaphragm 1 is curvedly supported by the support means 2 and receives a required amount of resiliency and tension from the resilient backing member 3. However, due to its arrangement, the conventional piezoelectric electro-acoustic transducer has a very low sound conversion efficiency. Further, in the conventional transducer, the resilient backing member wholly and uniformly contacts with the diaphragm and therefore, it is impossible to exclude an undesirable effect to the frequency characteristics of the conventional transducer.

An object of this invention is to provide a piezoelectric electro-acoustic transducer which is free from the above mentioned defects and assembled without any difficulty, whereby the improved sound characteristics can be obtained.

Another object of this invention is to provide a piezoelectric electro-acoustic transducer which is arranged so that the diaphragm of the transducer is provided with tension and resiliency by the specifically applied resilient backing member.

Essentially, according to the present invention, there is provided a pizoelectric electro-acoustic transducer comprising a support means having a pair of fixing members disposed to oppose each other, a piezoelectric diaphragm extendedly supported between said fixing members of the support means, and a resilient backing member brought into contact with the diaphragm, characterized in that said resilient backing member is provided with an area smaller than the substantial vibration area of the diaphragm to leave a portion of the diaphragm which is free from contact with said backing member.

This invention will now be more particularly described with reference to the accompanying drawings in which.

Figure 1:
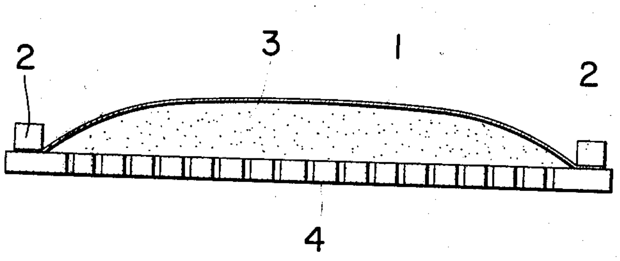
Fig. 1 Prior art
FIG. 1 is a sectional view of the principal structure of the conventional piezoelectric electro-acoustic transducer.
Figure 2:
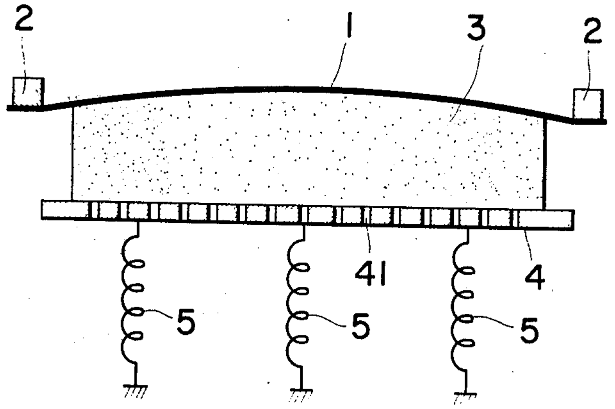
FIG. 2 is a sectional view of the principal structure of the piezoelectric electro-acoustic transducer emboby-ing this invention.
Figure 3:
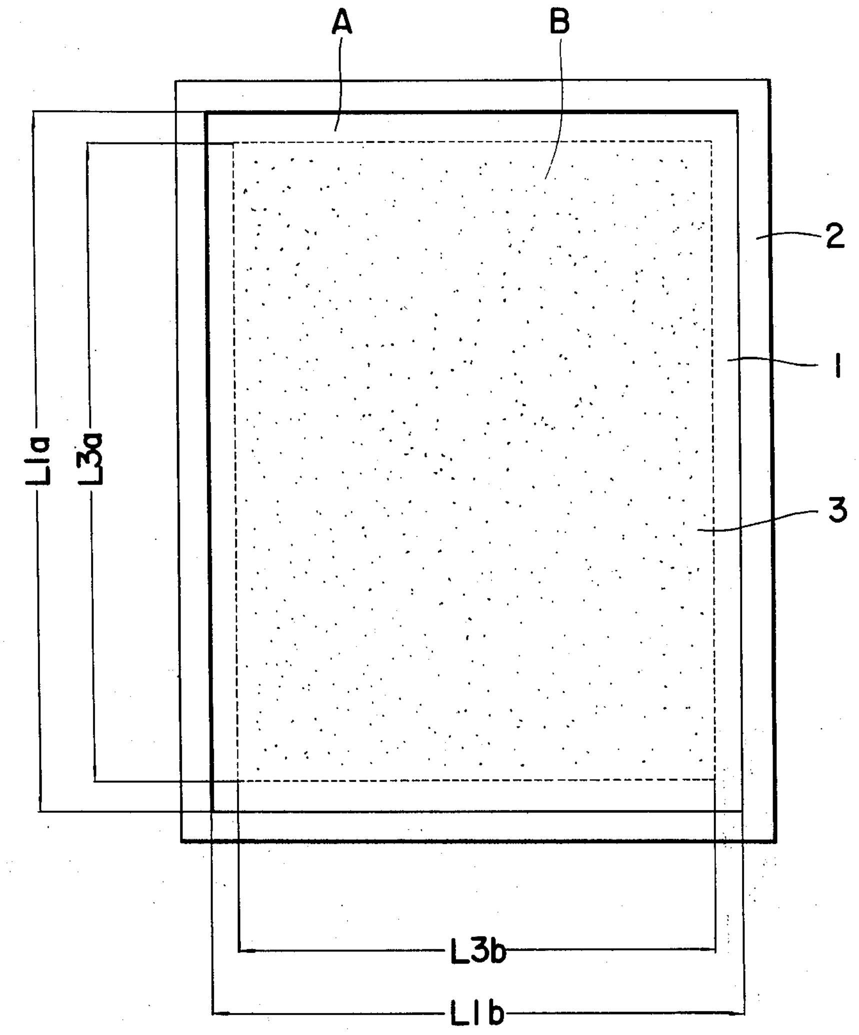
FIG. 3 is a plan view of the principal structure of the piezoelectric electro-acoustic transducer shown in FIG. 2.

Referring now to FIGS. 2 and 3, there is provided at numeral 1 a flexible diaphragm made of a high polymer film. The film is made from materials such as polyvinyl fluoride, polyvinyl chloride, nylon-11 and polypeptide, etc. The film is then subjected to a treatment in which the film is provided with a piezoelectric property. Numeral 2 indicates a support means of a stiff material comprising at least a pair of fixing members adapted to support the diaphragm 1. As shown in FIG. 3 the diaphragm 1 has a substantial vibrating portion encircled by the support means 2 and of area A which is L1*a* in length and L1*b* in width. Numeral 3 indicates a resilient backing member having an area B which is L3*a* in length and L3*b* in width. Numeral 4 indicates a base plate of a stiff material having a predetermined number of openings 41 of a given size as shown in FIG. 2. Numeral 5 indicates a spring means adapted to provide the base plate 4 with the required pressure. The spring means 5 are arranged so that the degree of the pressure to the base plate is adjusted to impart to the diaphragm 1 the suitable amount of tension and resiliency.

Now, it should be noted that the relation between the substantial vibrating area A of the diaphragm having L1*a* as its length and L1*b* as its width and the area B of the resilient backing member 3 having L3*a* as its length and L3*b* as its width is $A > B$ and consequently, $L1a > L3a$ and $L1b > L3b$ or $L1a \geqq L3a$ and $L1b = L3b$ or $L1a = L3a$ and $L1b \geqq L3b$.

In order to provide the diaphragm 1 with a required amount of tension and resiliency, the resilient backing member 3 is brought into contact at its one side with the diaphragm 1 which is supported by the support means 2. However, the resilient backing member 3 is so arranged as mentioned above that the resilient backing member 3 contacts the diaphragm 1 leaving the diaphragm 1 with a portion which is free from contact with the resilient backing member 3. The other side of the resilient backing means 3 is covered with the base plate 4 which receives the pressure from the spring means 5 so as to provide the diaphragm 1 with a desirable amount of tension and/or resiliency.

The support means 2 used in the embodiment is rectangular in form. However, the support means 2 of this invention is not restricted to rectangular but may be square or circular in form.

In the embodiment, there may be used a support means which is arranged to support ever edge portion of the diaphragm. In this case, however, it is not necessarily required to bring the resilient backing member into contact with the diaphragm in such a manner as not to have any direct contact with every portion of the diaphragm adjacent the members of the support means as previously described. The resilient backing member may be brought into contact with the diaphragm leaving the diaphragm with at least one portion of the diaphragm which is free from a contact with the backing member.

Though this invention is explained with the embodiment which embodies a piezoelectric speaker, the invention is, of course, applicable to other kind of electro-acoustic transducers such as a piezoelectric microphone, etc. which includes a diaphragm requiring tensioning.

What is claimed is:

1. A piezoelectric electro-acoustic transducer, comprising:

a support means having spaced, opposed fixing portions;

a flexible piezoelectric diaphragm having its entire peripheral portion supported by said fixing portions with the substantial vibration area of said diaphragm spanning the space between said fixing portions; and a resilient backing member supporting and in backing surface contact with a major portion of said diaphragm vibration area, the resilient backing member area engaging the diaphragm being sized close to but smaller than said diaphragm vibration area and leaving only a minor portion of said diaphragm vibration area, at the edge thereof, free of contact with said resilient backing member and extending beyond the backing member to said support means, and means located with respect to said support means for pressing said resilient backing means against only said major portion of said substantial vibration area and therewith tensioning said vibration area and curving the backed portion thereof.

2. A piezoelectric electro-acoustic transducer, comprising:

a support means having spaced, opposed fixing portions;

a flexible piezoelectric diaphragm supported by said fixing portions with the substantial vibration area of said diaphragm extending between said fixing portions;

a resilient backing member in backing surface contact with the major central portion of said diaphragm vibration area, said resilient backing member having an area somewhat smaller than said diaphragm vibration area, a minor portion of said diaphragm vibration area, at the edge thereof, being free of contact with said resilient backing member and extending beyond the backing member to said support means; and a stiff perforated base plate in backing contact with said resilient backing member, such that said resilient backing member is sandwiched between said base plate and said diaphragm, and resilient means in turn backing said base plate and pressing same against the contacting surface of said diaphragm and thereby tensioning the diaphragm to an extent controlled by said resilient means.

3. The transducer of claim 2 in which said base plate is at least at width equal to that of said resilient backing member and said resilient means comprise springs, said resilient backing member normally, and in the absence of external disturbance, resiliently shaping said diaphragm to a nonplanar condition.

4. The transducer of claim 2 in which said resilient backing member is blocklike with widely laterally spaced side faces close spaced laterally inboard from said support means.

5. A piezoelectric electro-transducer, comprising:

a support means having spaced, opposed fixing portions; a flexible piezoelectric diaphragm supported by said fixing portions with the substantial vibration area of said diaphragm extending between said fixing portions;

a resilient backing member in backing surface contact with the major central portion of said diaphragm vibration area, said resilient backing member having an area somewhat smaller than said diaphragm vibration area, a minor portion of said diaphragm vibration area, at the edge thereof, being free of contact with said resilient backing member and extending beyond the backing member to said support means, said diaphragm vibration area in one of its lateral dimensions fractionally exceeding the corresponding dimension of said resilient backing member.

6. The transducer of claim 5 in which said fixing portions comprise a pair of stiff substantially parallel fixing members between which the diaphragm vibration area laterally extends, laterally opposed sides of said resilient backing member being adjacent but spaced laterally inward from the corresponding fixing members by a dimension substantially less than the lateral spacing of said resilient backing member sides and leaving relatively narrow side edge portions of said diaphragm vibration area, immediately inboard of said fixing members, free of contact by said resilient backing members.

7. The transducer of claim 6 in which said support means comprises a rectangular frame, having opposed pairs of said fixing members defining the length and width sides thereof and bounding the perimeter of said diaphragm, the perimeter of said resilient backing means being offset inward from said support means leaving the perimetral portion of said diaphragm vibration area out of contact with said resilient backing member, wherein the thus unbacked diaphragm perimetral portion is everywhere substantially narrower than the backed portion of said diaphragm which it surrounds.

8. A piezoelectric electro-acoustic transducer, comprising:

a support means having spaced, opposed fixing portions;

a flexible piezoelectric diaphragm supported by said fixing portions with the substantial vibration area of said diaphragm extending between said fixing portions;

a resilient backing member in backing surface contact with the major central portion of said diaphragm vibration area, said resilient backing member having an area somewhat smaller than said diaphragm vibration area, a minor portion of said diaphragm vibration area, at the edge thereof, being free of contact with said resilient backing member and extending beyond the backing member to said support means, in which said support means is of substantially circular form wherein said spaced, opposed fixing portions are opposed segments of said circular support means located such that a narrow edge portion of said diaphragm vibration area is free of contact with said resilient backing member.

9. The transucer of claim 5 in which diaphragm is a thin piezoelectric film employing a high molecular weight polymer as its base material and wherein such film is made from material of the group consisting of polyvinyl flouride, polyvinyl chloride nylon-11 and poly-peptide.

* * * * *

UNITED STATES PATENT OFFICE

CERTIFICATE OF CORRECTION

Patent No. 3 997 804 Dated December 14, 1976

Inventor(s) Masahiko Tamura, Kiyonori Iwama and Toshikazu Yoshimi

It is certified that error appears in the above-identified patent and that said Letters Patent are hereby corrected as shown below:

IN THE HEADING

At paragraph [75];"Masaheko" should read ---Masahiko---; "Kiyononi" should read ---Kiyonori" and "Toshikagu" should read ---Toshikazu---.

Column 4, line 24; "members" should read ---member---.

Signed and Sealed this

First Day of March 1977

[SEAL]

*Attest:*

RUTH C. MASON
*Attesting Officer*

C. MARSHALL DANN
*Commissioner of Patents and Trademarks*